United States Patent
Sun et al.

(10) Patent No.: US 9,624,094 B1
(45) Date of Patent: Apr. 18, 2017

(54) HYDROGEN BARRIERS IN A COPPER INTERCONNECT PROCESS

(71) Applicant: Cypress Semiconductor Corporation, San Jose, CA (US)

(72) Inventors: Shan Sun, Monument, CO (US); Ali Keshavarzi, Los Altos, CA (US); Thomas Davenport, Denver, CO (US); Thurman John Rodgers, Woodside, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/088,557

(22) Filed: Apr. 1, 2016

Related U.S. Application Data

(60) Provisional application No. 62/255,211, filed on Nov. 13, 2015.

(51) Int. Cl.
*B81B 7/00* (2006.01)

(52) U.S. Cl.
CPC ........ *B81B 7/007* (2013.01); *B81B 2201/032* (2013.01); *B81B 2207/07* (2013.01); *B81B 2207/097* (2013.01)

(58) Field of Classification Search
None
See application file for complete search history.

(56) References Cited

U.S. PATENT DOCUMENTS

| | | | |
|---|---|---|---|
| 6,265,230 B1 | 7/2001 | Aggarwal et al. | |
| 6,773,930 B2 | 8/2004 | Summerfelt et al. | |
| 6,841,396 B2 | 1/2005 | Celii et al. | |
| 7,459,318 B2 | 12/2008 | Araujo et al. | |
| 8,581,401 B2 | 11/2013 | Lu et al. | |
| 2005/0145985 A1* | 7/2005 | Takaya | H01L 27/11502 257/532 |
| 2008/0237866 A1 | 10/2008 | Wang | |
| 2008/0257487 A1* | 10/2008 | Shioga | H01G 4/232 156/249 |

(Continued)

OTHER PUBLICATIONS

Yang et al., "Integration Process and Reliability FORSrBi2 Ta2O9-based Ferroelectric Memories," Journal of Semiconductor Technology and Science, vol. 1, No. 3, Sep. 2001.

(Continued)

*Primary Examiner* — Asok K Sarkar

(57) ABSTRACT

A microelectronic system including hydrogen barriers and copper pillars for wafer level packaging and method of fabricating the same are provided. Generally, the method includes: forming an insulating hydrogen barrier over a surface of a first chip; exposing at least a portion of an electrical contact electrically coupled to a component in the first chip by removing a portion of the insulating hydrogen barrier, the component including a material susceptible to degradation by hydrogen; forming a conducting hydrogen barrier over at least the exposed portion of the electrical contact; and forming a copper pillar over the conducting hydrogen barrier. In one embodiment, the material susceptible to degradation is lead zirconate titanate (PZT) and the microelectronic systems device is a ferroelectric random access memory including a ferroelectric capacitor with a PZT ferroelectric layer. Other embodiments are also disclosed.

20 Claims, 9 Drawing Sheets

(56) References Cited

U.S. PATENT DOCUMENTS

| | | |
|---|---|---|
| 2008/0258260 A1* | 10/2008 | Nagai ................ H01L 28/57 257/532 |
| 2010/0072527 A1 | 3/2010 | Ozaki |
| 2012/0064712 A1 | 3/2012 | Lei et al. |
| 2012/0129335 A1 | 5/2012 | Ikumo et al. |
| 2012/0273940 A1 | 11/2012 | Jo |
| 2014/0085829 A1 | 3/2014 | Yamashita |
| 2014/0134950 A1 | 5/2014 | Leedy |
| 2014/0284766 A1* | 9/2014 | Fujimori ........... H01L 27/11507 257/532 |
| 2014/0370673 A1 | 12/2014 | Zelner et al. |
| 2015/0054129 A1 | 2/2015 | Saigoh et al. |
| 2016/0190101 A1* | 6/2016 | Yu ..................... H01L 25/0657 257/774 |

OTHER PUBLICATIONS

International Search Report for International Application No. PCT/US16/59951 dated Jan. 30, 2017; 2 pages.
Written Opinion of the International Searching Authority for International Application No. PCT/US16/59951 dated Jan. 30, 2017; 7 pages.

* cited by examiner

HYDROGEN BARRIERS IN A COPPER INTERCONNECT PROCESS

CROSS-REFERENCE TO RELATED APPLICATIONS

This application claims the benefit of priority under 35 U.S.C. 119(e) to U.S. Provisional Patent Application Ser. No. 62/255,211, filed Nov. 13, 2015, which is incorporated by reference herein in its entirety.

TECHNICAL FIELD

The present disclosure relates generally to microelectronic system packaging, and more particularly, to a copper interconnect process to enable a face-to-face and wafer-level-chip-scale packaging and to a microelectronic system including hydrogen barriers and copper interconnects.

BACKGROUND

Wafer-level-chip-scale packaging (WLCSP) is a type of package for integrated circuits (ICs) or Micro-Electromechanical System (MEMS), having an area that no greater than 120% of the area of the chip or die it contains, and is generally surface mountable. Face-to-Face (F2F) packaging is a type of WLCSP in which multiple dies or chips of a microelectronic system are vertically stacked and electrically coupled within a single package reducing a size or footprint of the package. F2F packages utilize copper (Cu) pillar or bumps and redistribution layers (RDL) to interconnect bond pads formed on exposed facing surfaces of the chips. Cu pillars allow a finer pitch, reduce the probability of interconnect bridging, and decrease the capacitance load for the circuits, as compared to flip-chip technology using solder bumps, thereby allowing the microelectronic system to operate at higher frequencies. Multi-chip-modules (MCM) are particular advantageous for integrally packaging chips including circuits or components fabricated using incompatible technologies. For example, F2F packaging can be used where a first substrate or chip including logic circuits or a processor, typically fabricated using complementary metal-oxide-semiconductor (CMOS) technology, is electrically coupled to and integrally packaged with a second chip including an IC, such as a memory, or a MEMS fabricated using processes incompatible with CMOS technology.

Problems with conventional F2F packaging utilizing Cu pillar and/or RDLs include diffusion of hydrogen through conductive and non-conductive layers surrounding a component in the IC or MEMS including a material susceptible to degradation by hydrogen. For example, a ferroelectric random access memory (F-RAM) including a ferroelectric capacitor with a lead zirconate titanate (PZT) ferroelectric layer or a MEMS with a piezoelectric layer including PZT. It has been observed that when PZT is exposed to hydrogen, particular at elevated temperatures, the electrical properties of a PZT layer are severely degraded. Generally, there are two ways in which hydrogen is introduced to F2F packaged components. The first is during standard processing techniques used to form the Cu pillars and RDL, or other interconnects which typically require hydrogen species at elevated process temperatures. The second is from hydrogen generated within the chip itself. For example, water adsorbed within permeable layer of the chip structure can react with metals causing dissociation of the water releasing hydrogen.

Thus, there is a need for a F2F package and packaging method that minimizes hydrogen penetration into ICs or MEMS including a material susceptible to degradation by hydrogen generated during the packaging and interconnect forming processes. It is further desirable that structure of the F2F package minimizes penetration into ICs or MEMS of environmental hydrogen external to the chip itself.

SUMMARY

A microelectronic system including copper pillars and hydrogen barriers to minimize hydrogen penetration into a component incorporating a material that renders the component susceptible to degradation by hydrogen during forming the copper pillars is provided. The component is formed in a first substrate or chip, and the microelectronic system further includes an insulating hydrogen barrier over a surface of the first chip, the insulating hydrogen barrier having an opening exposing at least a portion of an electrical contact electrically coupled to the component, and a conducting hydrogen barrier over at least the exposed portion of the electrical contact. The copper pillar is formed over a top surface of the conducting hydrogen barrier and electrically coupled to the component through the conducting hydrogen barrier and the electrical contact. The material that renders the component susceptible to degradation can include lead zirconate titanate (PZT). In one embodiment, the microelectronic system can include a Micro-Electromechanical Systems (MEMS) device including PZT. In another embodiment, the microelectronic system can include a ferroelectric random access memory (F-RAM), and the component includes a ferroelectric capacitor incorporating a PZT ferroelectric layer.

In one embodiment, a method of fabricating the microelectronic system includes forming an insulating hydrogen barrier over a surface of a first chip, and exposing at least a portion of an electrical contact to a component in the first chip by removing a portion of the insulating hydrogen barrier. The component includes a material that renders the component susceptible to degradation by hydrogen. A conducting hydrogen barrier is then formed over the exposed portion of the electrical contact and at least a portion of the insulating hydrogen barrier. A copper pillar is formed over the conducting hydrogen barrier, while the insulating hydrogen barrier and the conducting hydrogen barrier minimizes hydrogen penetration into the material of the component.

In one embodiment, the method further includes patterning the conducting hydrogen barrier to form a redistribution layer (RDL) prior to forming the copper pillar on the RDL over the insulating hydrogen barrier.

In another embodiment, the method further includes forming a copper (Cu) RDL on the conducting hydrogen barrier and patterning the Cu RDL and conducting hydrogen barrier prior to forming the copper pillar over a portion of the Cu RDL over the insulating hydrogen barrier, while the insulating hydrogen barrier and the conducting hydrogen barrier minimizes hydrogen penetration into the material susceptible to degradation during forming the Cu RDL.

BRIEF DESCRIPTION OF THE DRAWINGS

Embodiments of the present invention will be understood more fully from the detailed description that follows and from the accompanying drawings and the appended claims provided below, where:

DETAILED DESCRIPTION

Embodiments of face-to-face (F2F) packages including copper pillars and redistribution layers and methods of fabricating the same to minimize hydrogen penetration into a material susceptible to degradation by hydrogen are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1A:
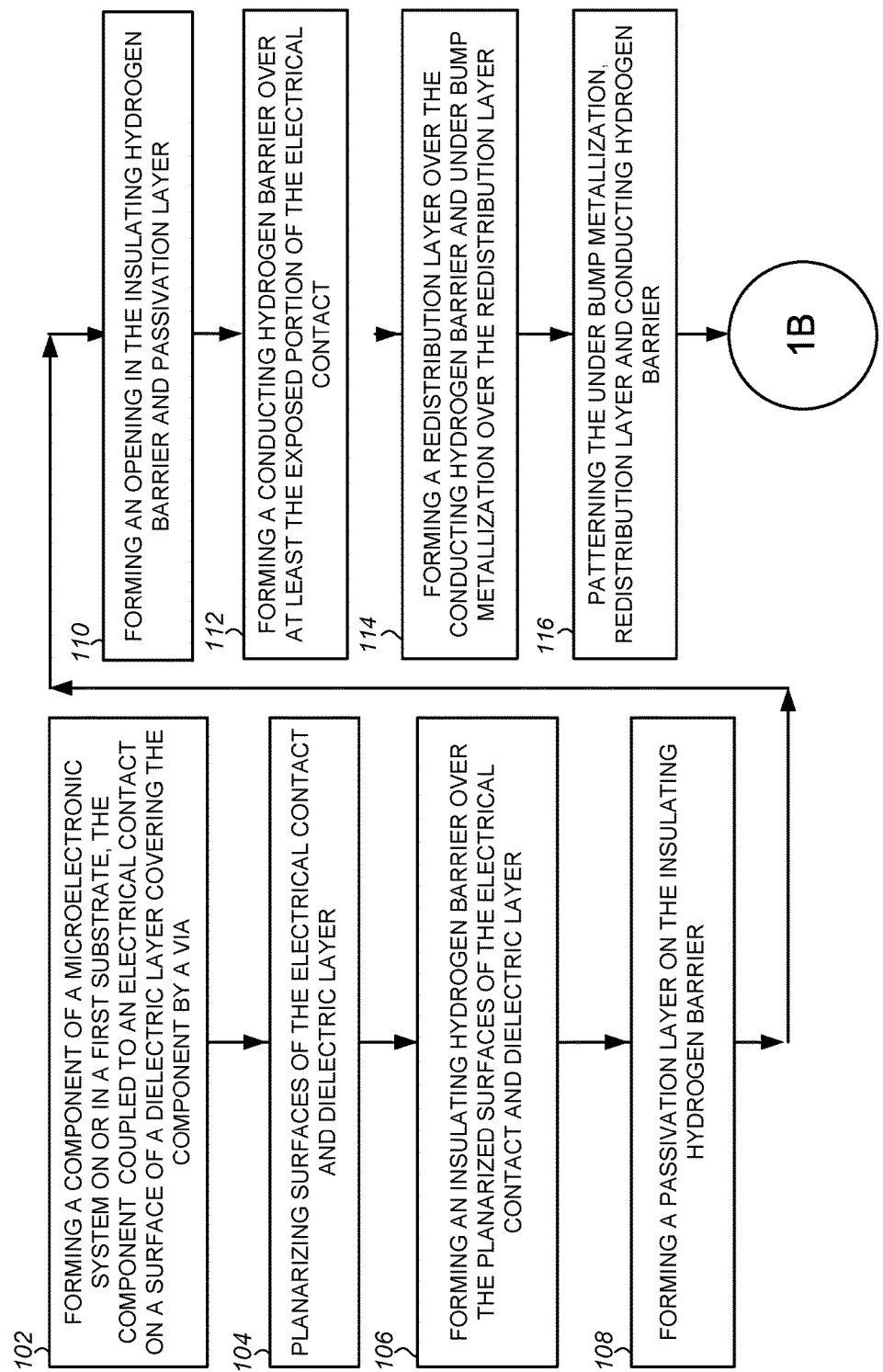
FIGS. 1A and 1B are a flowchart illustrating an embodiment of a method for packaging a microelectronic system in a face-to-face package including copper pillars and a copper redistribution layer according to an embodiment of the present disclosure.
Figure 1B:
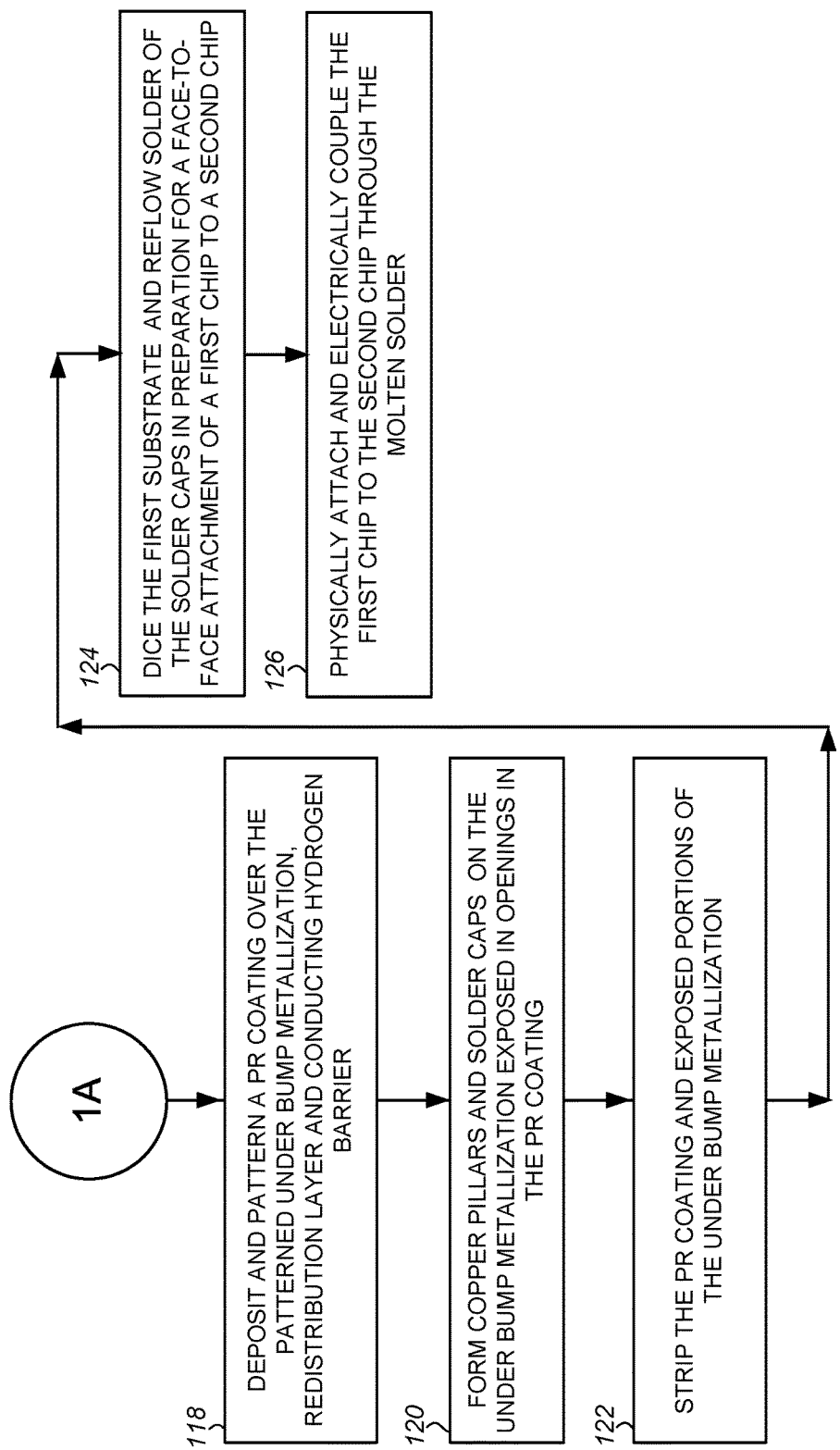

Embodiments of a F2F packaging method to minimize hydrogen penetration into a material susceptible to degradation by hydrogen will now be described in detail with reference to FIGS. 1A and 1B, FIGS. 2A-2L and FIG. 3. FIGS. 1A and 1B are a flowchart illustrating an embodiment of a method for packaging a microelectronic system in a F2F package including Cu pillars and a Cu RDL. FIGS. 2A-2L are block diagrams illustrating cross-sectional views of a portion of the microelectronic system formed by the method of the flowchart of FIGS. 1A and 1B. FIG. 3 is a block diagram illustrating a cross-sectional view of a portion of the microelectronic system prepared for packaging according to another embodiment of the method of the present disclosure.

Figure 2A:
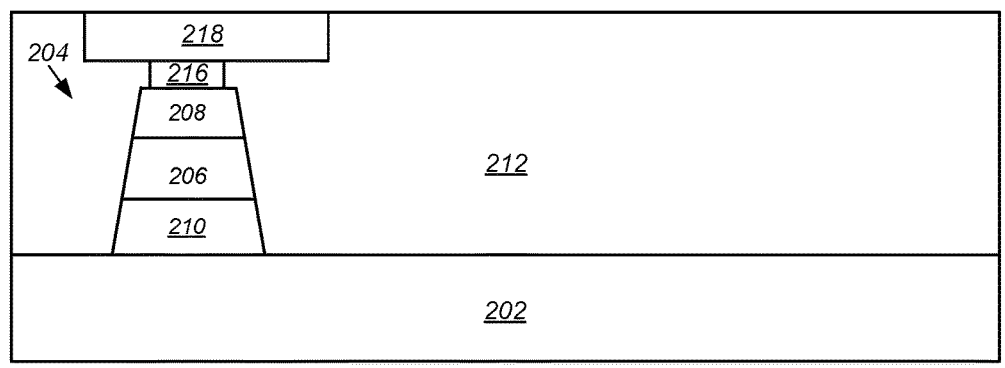
FIGS. 2A-2L are block diagrams illustrating cross-sectional views of a portion of the microelectronic system formed by the method of the flowchart of FIGS. 1A and 1B.
Figure 3:
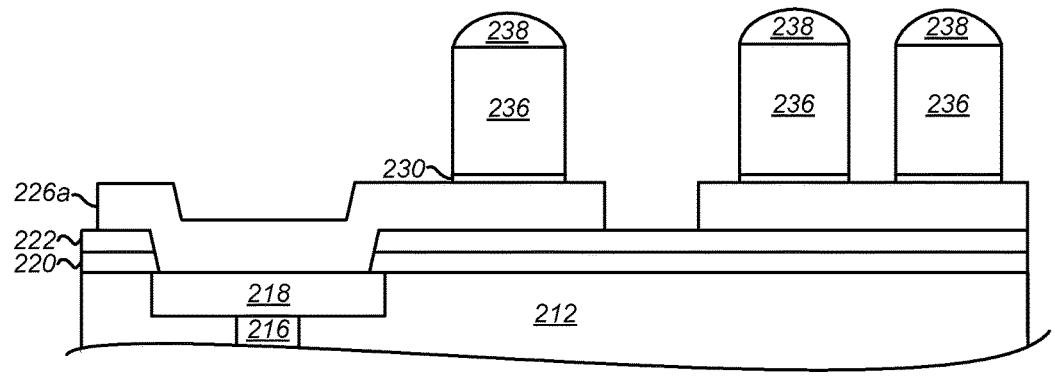
FIG. 3 is a block diagram illustrating a cross-sectional view of a portion of the microelectronic system according to another embodiment of the method of the present disclosure.

Referring to FIG. 1A and FIG. 2A, the process begins with forming a component of a microelectronic system on or in a first substrate or chip 202 (step 102). In the embodiment shown in FIG. 2A, the microelectronic system is or includes a ferroelectric random access memory (F-RAM), and the component is a ferroelectric capacitor 204 incorporating a material susceptible to degradation by hydrogen. The ferroelectric capacitor 204 includes a ferroelectric material 206 between an upper electrode 208 and a lower electrode 210 covered by or embedded in a dielectric layer 212. In addition to the ferroelectric capacitor 204 each cell in the F-RAM further includes a number of transistors electrically coupled to the lower electrode 210 through a metallization layer (not shown). The upper electrode 208 is electrically coupled through a vertical contact or via 216 extending through the dielectric layer 212 to an electrical contact 218 formed from a second metallization layer. Although not shown, it will be understood the ferroelectric capacitor 204 can be overlaid by multiple dielectric layers, and the upper electrode 208 is electrically coupled to the via 216, through one or more additional metal layers formed on or in the by multiple dielectric layers.

The ferroelectric capacitor 204, dielectric layer 212, via 216 and electrical contact 218 are formed using a standard deposition and photolithographic process flows. The upper electrode 208 and lower electrode 210 can include one or more layers of iridium or iridium oxide having a thickness of from about 0.05 to about 0.20 μm, and are deposited or formed using chemical vapor deposition (CVD), atomic layer deposition (ALD) or physical vapor deposition (PVD). The via 216 and electrical contact 218 can be or include aluminum, titanium, tungsten, copper or alloys or mixtures thereof, and can be deposited by PVD, such as sputtering, evaporation, or electroless plating to a thickness of from about 1000 to about 5000 Å (angstroms). Dielectric layer 212 can include one or more layers of an undoped oxide, such as silicon-dioxide ($SiO_2$), a nitride, such as silicon nitride ($Si_xN_y$), a silicon-oxynitride ($Si_xO_yN_z$), aluminum oxide, or phosphosilicate glass (PSG) deposited by CVD, PVD or ALD. For example, in one embodiment the dielectric layer 212 can include a $SiO_2$ having a thickness of from about 0.60 to about 0.80 μm, by deposited by low pressure CVD (LPCVD) using tetraethyl-orthosilicate (TEOS) based process gas or precursors.

The ferroelectric material 206 generally includes a material such as lead zirconate titanate (PZT) $Pb[Zr_xTi_{1-x}]O_3$, which is susceptible to degradation by hydrogen and is deposited to a thickness of from about 0.04 to about 0.10 μm, using CVD, ALD or PVD. Data is stored in the ferroelectric capacitor by applying an external electric field across a ferroelectric material, which causes dipoles in the ferroelectric material to switch and align with the field direction. After the electric field is removed data is stored in the cell using a remnant polarization of the ferroelectric material. As hydrogen penetrates or diffuses into the ferroelectric material, the oxide of the PZT undergoes reduction. Electrically this is observed as a decrease in the switchable, remnant polarization that remains once the applied field is removed.

Optionally, where the via 216 includes tungsten (W), and/or the lower electrode 210 is electrically coupled to a tungsten plug or metallization layer, the ferroelectric capacitor 204 can further include conductive oxygen ($O_2$) barriers between the top electrode 208 and via 216 and between the lower electrode 210 additional metal layer. Additionally, the ferroelectric capacitor 204 can further include sidewall encapsulation layers between the ferroelectric capacitor and dielectric layer 212.

Next, as indicated in step 104 of FIG. 1A, the surfaces of the electrical contact 218 and dielectric layer 212 are planarized, for example, using a chemical mechanical polishing (CMP) process.

Figure 2B:
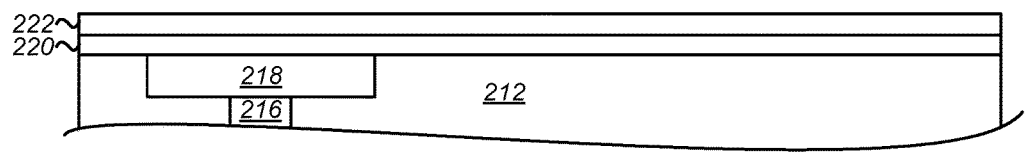

Referring to FIGS. 1A and 2B an insulating hydrogen barrier 220 is then formed over and/or directly on the planarized surfaces of the electrical contact 218 and dielectric layer 212 (step 106). The insulating hydrogen barrier 220 can be or include one or more layers of aluminum oxide ($Al_2O_3$) having a thickness of from about 500 to about 2500 Å or a silicon oxynitride (SiON) having a thickness of from about 1000 Å to about 3000 Å, and deposited by CVD or ALD.

In some embodiments, such as that shown in FIG. 2B, a passivation layer 222 is formed on the insulating hydrogen barrier 220 (step 108). The passivation layer 222 can be or include one or more layers of dielectric material, such as silicate glass (USG), silicon nitride, silicon oxide, polymer, polyimides or combinations thereof. In one embodiment, the passivation layer 222 includes a polyimide (PI) deposited by spin-on deposition and having a thickness of about 0.85 μm. Alternatively, thinner passivation layers 222 can include a dielectric, such as silicon nitride (SiN) deposited by CVD or ALD.

Figure 2C:
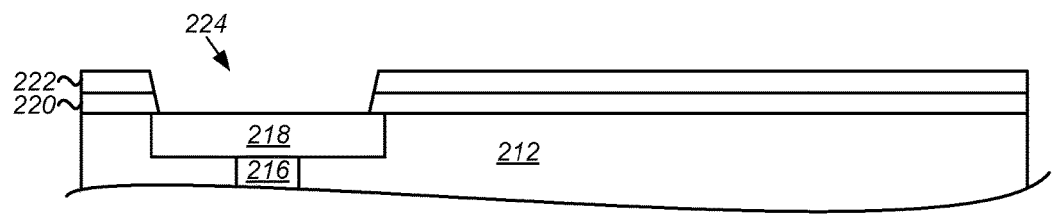

Next, referring to FIGS. 1A and 2C a first opening 224 is formed in the insulating hydrogen barrier 220, and passivation layer 222 if present, exposing at least a portion of the electrical contact 218 (step 110). First opening 224 can be etched using standard photolithographic and dry or wet etching techniques. For example, a patterned photoresist layer (not shown) can be formed on the passivation layer 222, and where the passivation layer includes silicon nitride or silicon oxide and the insulating hydrogen barrier 220 includes $Al_2O_3$, both layers can be etched in a wet etch process using a buffered oxide etch (BOE), a hydrofluoric (HF) wet etch, a pad etch, or any other similar hydrofluoric-based wet etching chemistry. Alternatively, the etch can be accomplished in a dry etch process conducted by any conventional method known to those of ordinary skill in the art for the etching of openings through a dielectric. Non-limiting examples of dry etch methods include etching using etchants such as Sulfur hexafluoride ($SF_6$), Chlorine ($Cl_2$), Trifluoromethane ($CHF_3$)/Chlorine fluoride ($Cl_2F_6$) hydrogen fluoride (HF), hydrogen chloride (HCl), Carbon tetrachloride ($CCl_4$) and mixtures thereof may be used in conventional RF or reactive ion etching. In a particular, advantageous embodiment both the passivation layer 222, and the insulating hydrogen barrier 220 are etched sequentially or simultaneously in a single etch process.

Figure 2D:
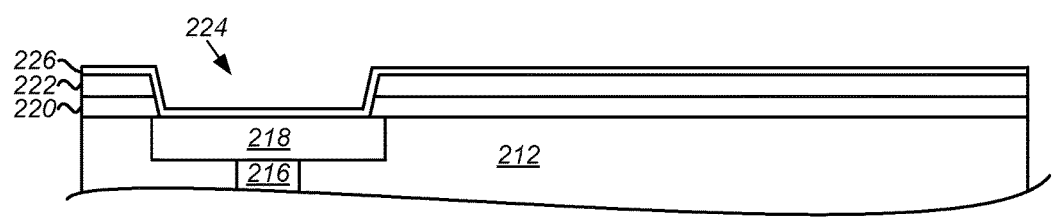

Referring to FIGS. 1A and 2D a conducting hydrogen barrier 226 is formed over at least the exposed portion of the electrical contact 218 (step 112). Generally, the conducting hydrogen barrier is formed over at least a portion of the passivation layer 222 and insulating hydrogen barrier 220, and in some embodiments, such as that shown, the conducting hydrogen barrier 226 is formed over and directly on substantially an entire surface of the passivation layer 222. The conducting hydrogen barrier 226 can be or include one or more layers of titanium-aluminum-nitride (TiAlN), aluminum titanium nitride (AlTiN), titanium nitride (TiN), titanium oxynitride (TiON), titanium aluminum oxynitride (TiAlON) or aluminum (Al) deposited by PVD, CVD or electroless plating. In one embodiment, the conducting hydrogen barrier 226 can be or include one or more layers of TiAlN or AlTiN having a thickness of from about 0.1 μm to about 0.3 deposited by PVD.

Figure 2E:
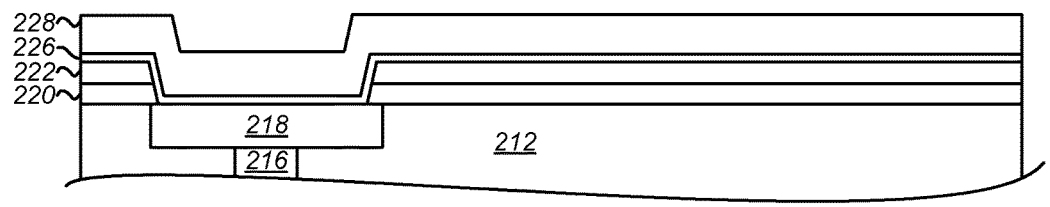

In some embodiments, such as that shown in FIG. 2E, a separate, dedicated redistribution layer (RDL) 228 is formed over the conducting hydrogen barrier 226 (step 114). The RDL 228 serves to redistribute or relocate subsequently formed pads or pillars that are electrically coupled to the contact 218 away from a location directly over the contact. The RDL 228 can be or include one or more layers of a metal, such as aluminum, titanium, tungsten, copper or alloys or mixtures thereof, and can be deposited by CVD, PVD or electroless plating. In one embodiment, the RDL 228 includes copper (Cu) having a thickness of from about 0.1 μm to about 0.5 μm, deposited by electroless plating. In electroless plating reactions occur in an aqueous solution without the use of external electrical power and can include or involve reactions that result in the release of hydrogen. The insulating hydrogen barrier 220 and the conducting hydrogen barrier 226 minimizes or substantially eliminates hydrogen penetration into the ferroelectric material 206 of the ferroelectric capacitor 204 during the forming of the Cu RDL 228. In another embodiment in which the RDL 228 may include aluminum (Al) deposited by PVD.

As noted above, the ferroelectric material 206 generally includes a material such PZT, which is susceptible to degradation by hydrogen. In conventional copper deposition processes hydrogen can diffuse into the PZT through the RDL and/or a conventional passivation, the contact 218, via 216 and upper electrode 208. In the method of the present disclosure the insulating hydrogen barrier 220 and the conducting hydrogen barrier 226 isolate the contact 218 from the hydrogen used or generated in the CVD process, minimizing or substantially eliminating hydrogen penetration into the ferroelectric material 206 of the ferroelectric capacitor 204 during the forming of a Cu RDL 228.

Generally, the RDL 228 is formed directly on the conducting hydrogen barrier 226 overlying the contact 218, and over at least a portion of conducting hydrogen barrier overlying the passivation layer 222 and insulating hydrogen barrier 220. In some embodiments, such as that shown, the RDL 228 is formed directly on substantially an entire surface of the conducting hydrogen barrier 226 overlying the passivation layer 222 and insulating hydrogen barrier 220.

Figure 2F:
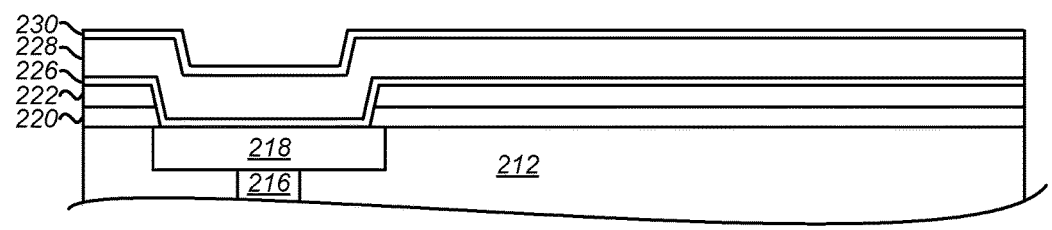

Optionally, in some embodiments, such as that shown in FIG. 2F, step 114 further includes forming under bump metallization (UBM) 230 over the conducting hydrogen barrier 226 and RDL 228. The UBM 230 can be or include one or more layers of a metal or metal alloy selected to serve as an adhesion or glue layer, a diffusion barrier and/or a seed layer. Generally, the UBM 230 is formed of titanium, tantalum, titanium nitride, tantalum nitride by PVD. In one embodiment, the UBM 230 can include a thickness of from about 100 to about 300 Å deposited directly on the RDL 228 by a PVD process, such as sputtering or evaporation.

Figure 2G:
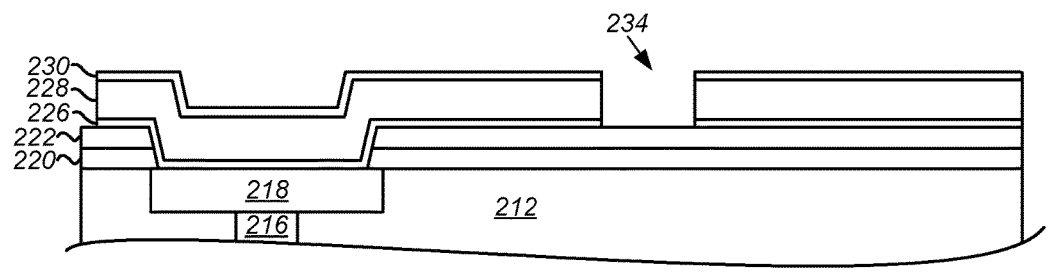

Next, referring to FIGS. 1A and 2G the UBM 230, RDL 228 and conducting hydrogen barrier 226 are patterned (step 116). The UBM 230, RDL 228 and conducting hydrogen barrier 226 can be patterned using standard photolithographic and dry or wet etching techniques. For example, a patterned photoresist layer (not shown) can be formed on the UBM 230, and the RDL 228 includes copper, and the conducting hydrogen barrier 226 includes TiAlN, all of the layers can be etched in a wet etch process using a solution including an acid, such as nitric, acetic or sulfuric acid, and an oxidizing agent, such as hydrogen peroxide, permanganate, ferric ion, bromine or chromium.

Figure 2H:
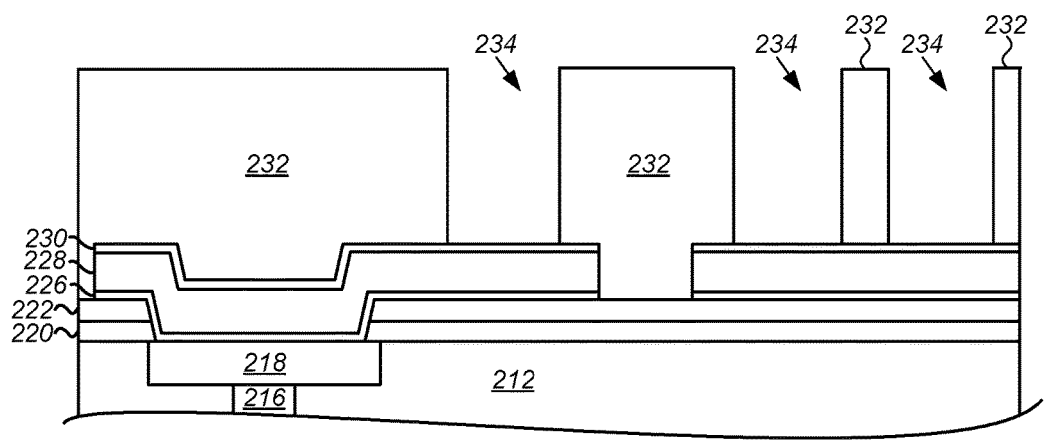

Referring to FIGS. 1B and 2H a photoresist (PR) coating 232 is deposited over the patterned UBM 230, RDL 228 and conducting hydrogen barrier 226 and patterned using standard photolithographic techniques to form second openings 234 therein (step 118).

Figure 2I:
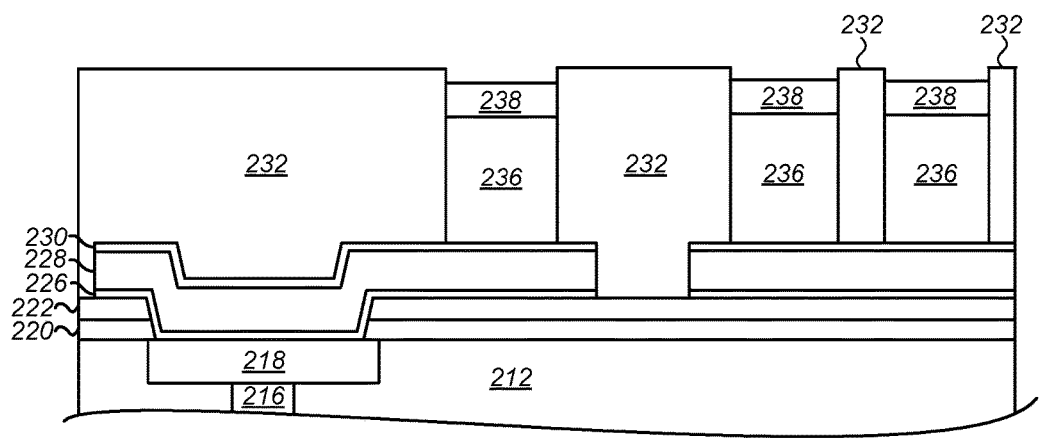

Next, referring to FIGS. 1B and 2I copper (Cu) bumps or pillars 236 are formed in the second openings 234 on the UBM 230 exposed therein, and solder caps 238 formed on the pillars (step 120). The Cu pillars 236 can be deposited to a thickness or height above the UBM 230 of from about 60 to about 130 µm by electroless plating. The electroless plating process can include or involve release of hydrogen. The insulating hydrogen barrier 220 and the conducting hydrogen barrier 226 minimizes or substantially eliminates hydrogen penetration into the ferroelectric material 206 of the ferroelectric capacitor 204 during the forming of the copper pillars 236. The solder caps 238 can include tin, silver, lead, Cu, zinc, indium, gold, bismuth, antimony or alloys thereof, and are be deposited directly on the Cu pillars 236 to a thickness of from about 60 to about 130 µm by applying a solder paste over the PR coating 232. The solder paste is then melted and reflowed after the PR coating has been removed to form solder caps 238.

Figure 2J:
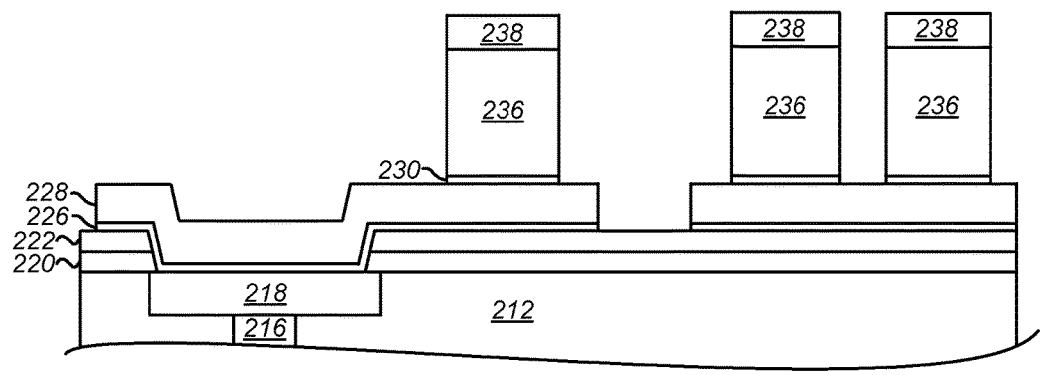

Referring to FIGS. 1B and 2J the patterned PR coating 232 is removed or stripped using standard photolithographic techniques, and exposed portions of the UBM 230, not underlying the copper pillars 236 removed (step 122). As with the step of patterning the UBM 230, step 116, described above, the exposed portions of the UBM can be removed in a wet etch process using a solution including an acid, such as nitric, acetic or sulfuric acid, and an oxidizing agent, such as hydrogen peroxide, permanganate, ferric ion, bromine or chromium. Alternatively, the exposed portions of the UBM can be removed in a dry etch process using the copper pillars 236 as a mask. In another alternative embodiment, the UBM 230, which is conductive, can be substantially left on the RDL 228, thereby eliminating a process step.

Figure 2K:
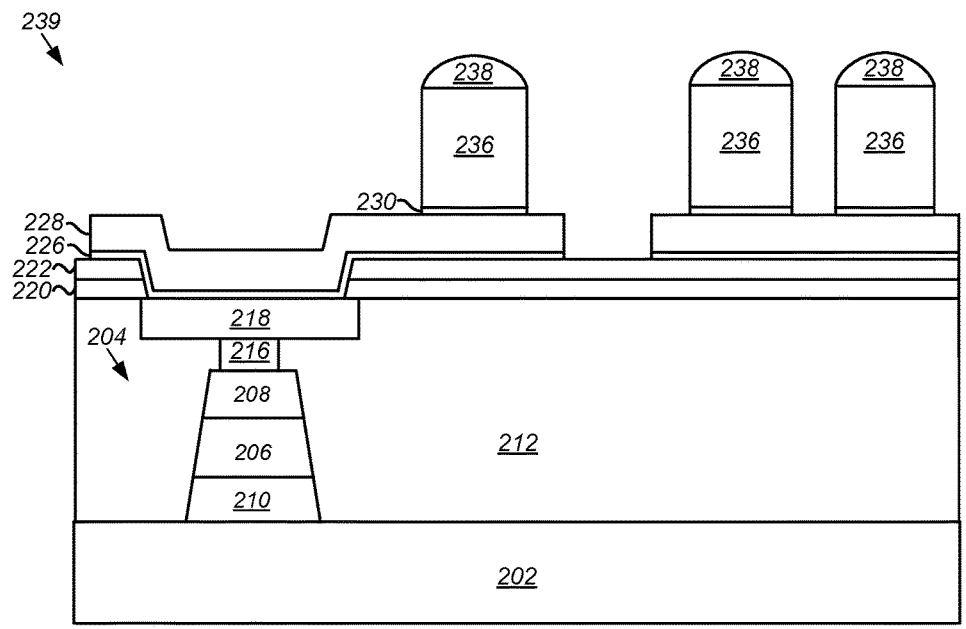

Next, referring to FIGS. 1B and 2K the substrate is singulated or diced to form a number of individual die or first chips 239, and solder caps 238 are softened or melted in a reflow soldering process in preparation for a face-to-face attachment to a companion-die or second substrate or chip (not shown in FIG. 2K) (step 124). Generally, as shown in FIG. 2K each of the individual first chips 239 include one or more components of the microelectronic system, such as the ferroelectric capacitor 204, and one or more Cu pillars 236 through which the die can be physically attached and electrically coupled to the companion-die or second chip.

Figure 2L:
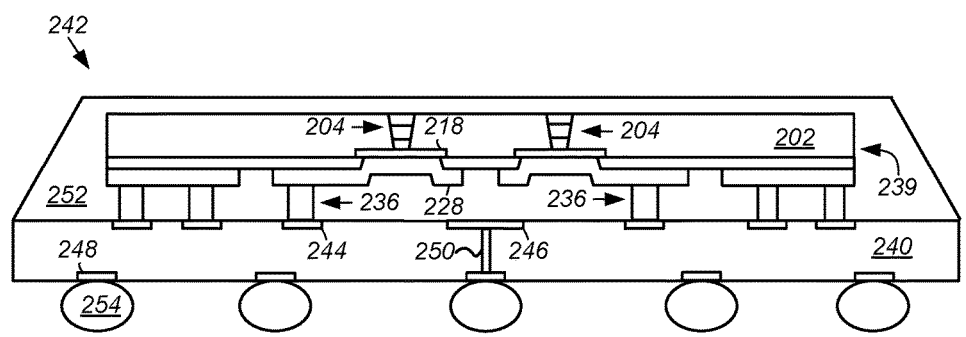

Finally, referring to FIGS. 1B and 2L the first chip 239 formed from the singulated or diced first substrate 202 is physically attached and electrically coupled to the companion-die or second chip 240 through the molten solder caps 238 to form a WLCSP or F2F package 242 as shown in FIG. 2L (step 126). Referring to FIG. 2L the second substrate or chip 240 includes first pads 244 on a top or facing surface to which the Cu pillars 236 are bonded and through which a number of other components, such as ICs 246, formed on the second chip can be electrically coupled to components of the microelectronic system on the first chip 202. Additionally, the second chip 240 can further include second pads 248 on a lower or opposing surface electrically coupled to the first pads 244 and/or ICs 246 formed in or on the second chip by means of a number of through silicon vias (TSVs) 250. The first and second chips 202 and 240 can be encapsulated in a dielectric or plastic molding compound 252 and physically attached and/or electrically coupled to an external circuit via a number of a ball grid array 254 on the second chip, or a backplane to which the second chip is attached, to form a flat, no-lead package, such as a Quad Flat-pack No-lead (QFN) package.

Alternatively, in another embodiment (not shown) the F2F package 242 is an open cavity type package in which the first and second chips 202 and 240 are positioned in an open cavity and enclosed by plastic, ceramic, glass or metal sidewalls attached to the second chip, or a backplane and top wall or lid joining the sidewalls. Additionally, the second chip 240 can be attached or wire bonded to a lead frame through which the first and second chips 202 and 240 can be electrically coupled to an external circuit.

In yet another alternative embodiment, shown in FIG. 3, the conducting hydrogen barrier 226a includes a material and a thickness selected to serve as a redistribution layer (RDL) to redistribute or relocate subsequently formed pads or pillars that are electrically coupled to the contact 218 away from a location directly over the contact. The RDL/conducting hydrogen barrier 226a can include a single layer of titanium-aluminum-nitride (TiAlN), aluminum titanium nitride (AlTiN), titanium nitride (TiN), titanium oxynitride (TiON), titanium aluminum oxynitride (TiAlON) or aluminum (Al) deposited by PVD, CVD or electroless plating. In one version of this embodiment the RDL/conducting hydrogen barrier 226a can include a single layer of TiAlN or AlTiN having a thickness of from about 0.5 µm to about 1.5 µm, deposited by PVD process such as sputtering or evaporation. It will be understood that this embodiment is advantageous in that it eliminates the need for a separate deposition and etch steps for a dedicated RDL 228, and can further minimize hydrogen penetration into the ferroelectric material 206 of the ferroelectric capacitor 204 during processing by eliminating a Cu RDL 228.

Finally, in another alternative embodiment, the microelectronic system is or can include a Micro-Electromechanical System (MEMS) having a component including a piezoelectric material susceptible to hydrogen degradation. Exemplary MEMS can include microphones, motion or position sensors, such as gyroscopes, accelerometers, and magnetometers, light modulators, resonators, transducers, and actuators or pumps, such as those used in inkjet print heads. An embodiment of a microelectronic system including a motion/positon sensing MEMS 256 having a component and including a piezoelectric material 258, such as PZT, is shown in FIG. 4.

Figure 4:
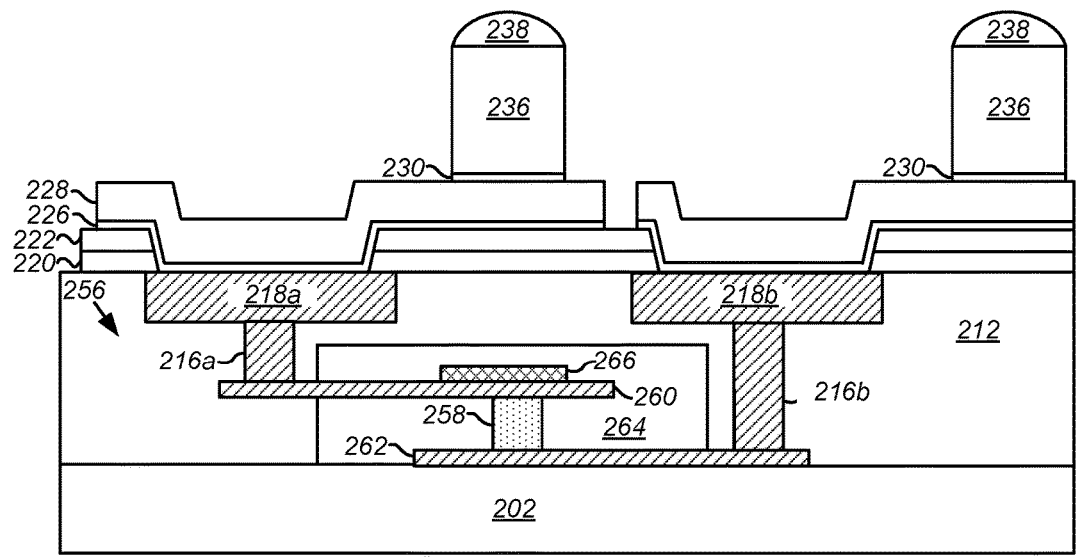
FIG. 4 is a block diagram illustrating cross-sectional views of a portion of the microelectronic system including a Micro-Electromechanical System (MEMS) formed by the method of the flowchart of FIGS. 1A and 1B.

Referring to FIG. 4, in addition to the piezoelectric material 258 the MEMS includes an upper electrode 260 and a lower electrode 262 coupled to the piezoelectric material, and a test mass 266 formed on the upper electrode over the piezoelectric material, all enclosed in a cavity 264 formed in the dielectric layer 212. The upper electrode 260 also serves as a spring for the test mass 266. In operation, acceleration of the MEMS 256 exerts a force on the piezoelectric material 258, which can be detected and measured by a change in the electrostatic force or voltage generated by the piezoelectric material across the upper electrode 260 and lower electrode 262.

Thus, embodiments of ferroelectric random access memories including a copper interconnect process to enable face-to-face (F2F) and Wafer-level-chip-scale packaging (WLCSP) packaging and to a microelectronic system including hydrogen barriers and copper interconnects have been described. Although the present disclosure has been described with reference to specific exemplary embodiments, it will be evident that various modifications and changes may be made to these embodiments without departing from the broader spirit and scope of the disclosure.

Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of fabricating a microelectronic system, the method comprising:
    forming an insulating hydrogen barrier over a surface of a first chip and on an electrical contact electrically coupled to a component in the first chip, the insulating hydrogen barrier comprising aluminum oxide ($Al_2O_3$);
    forming a passivation layer on the insulating hydrogen barrier;
    exposing at least a portion of the electrical contact electrically coupled to a component in the first chip by removing a portion of the passivation layer and the insulating hydrogen barrier, the component comprising lead zirconate titanate (PZT);
    forming a conducting hydrogen barrier on the passivation layer and the exposed portion of the electrical contact; and
    forming a copper pillar over the conducting hydrogen barrier.

2. The method of claim 1 further comprising forming an under bump metallization (UBM) layer over the conducting hydrogen barrier prior to forming the copper pillar, and wherein the copper pillar is formed on the UBM layer.

3. The method of claim 2 wherein forming the conducting hydrogen barrier comprises forming the conducting hydrogen barrier over at least a portion of the insulating hydrogen barrier, and further comprising patterning the conducting hydrogen barrier to form a redistribution layer (RDL) prior to forming the copper pillar on the RDL over the insulating hydrogen barrier.

4. The method of claim 2 wherein forming the conducting hydrogen barrier comprises forming the conducting hydrogen barrier over at least a portion of the insulating hydrogen barrier, and further comprising forming a redistribution layer (RDL) on the conducting hydrogen barrier and patterning the RDL and conducting hydrogen barrier prior to forming the copper pillar over a portion of the RDL over the insulating hydrogen barrier.

5. The method of claim 4 wherein the RDL comprises copper (Cu).

6. The method of claim 1 wherein the conducting hydrogen barrier comprises titanium-aluminum-nitride (TiAlN) or aluminum titanium nitride (AlTiN).

7. The method of claim 1 wherein the microelectronic system comprises a Micro-Electromechanical Systems (MEMS) device including the component comprising PZT.

8. The method of claim 1 wherein the microelectronic system comprises a ferroelectric random access memory and the component comprises a ferroelectric capacitor including a ferroelectric layer comprising PZT.

9. The method of claim 1 further comprising bonding and electrically connecting the first chip to a second chip through the copper pillars and enclosing the first chip and the second chip to form a face-to-face (F2F) package.

10. The method of claim 1 wherein forming the conducting hydrogen barrier consists of forming a single layer of titanium-aluminum-nitride (TiAlN) or aluminum titanium nitride (AlTiN) directly on the passivation layer and the exposed portion of the electrical contact, and in contact with at least a portion of the insulating hydrogen barrier.

11. A method comprising:
    forming an insulating hydrogen barrier over a surface of a first chip and on an electrical contact to a component in the first chip, the insulating hydrogen barrier comprising silicon oxynitride (SiON);
    forming a passivation layer on the insulating hydrogen barrier, the passivation layer comprising silicon nitride;
    removing at least a portion of the passivation layer and the insulating hydrogen barrier such that at least a portion of the surface of the electrical contact to the component is exposed, the component including a material susceptible to degradation by hydrogen;
    forming a conducting hydrogen barrier on the passivation layer and the exposed portion of the electrical contact and at least a remaining portion of the insulating hydrogen barrier, the conducting hydrogen barrier comprising titanium-aluminum-nitride (TiAlN) or aluminum titanium nitride (AlTiN); and
    forming a copper pillar over the conducting hydrogen barrier, wherein the insulating hydrogen barrier and the conducting hydrogen barrier minimizes hydrogen penetration into the material susceptible to degradation during forming the copper pillar.

12. The method of claim 11 further comprising forming a copper (Cu) redistribution layer (RDL) on the conducting hydrogen barrier and patterning the Cu RDL and conducting hydrogen barrier prior to forming the copper pillar over a portion of the Cu RDL over the insulating hydrogen barrier, wherein the insulating hydrogen barrier and the conducting hydrogen barrier minimizes hydrogen penetration into the material susceptible to degradation during forming the Cu RDL.

13. The method of claim 11 wherein forming the conducting hydrogen barrier consists of forming a single layer of TiAlN or AlTiN directly on the passivation layer and the exposed portion of the electrical contact, and in contact with at least a portion of the insulating hydrogen barrier.

14. A microelectronic system comprising:
    a component in a first chip, the component comprising lead zirconate titanate (PZT);
    an insulating hydrogen barrier on a surface of the first chip and at least a first portion of an electrical contact to the component, the insulating hydrogen barrier comprising silicon oxynitride (SiON);
    a passivation layer on the insulating hydrogen barrier, the passivation layer comprising silicon nitride;
    an opening extending though the passivation layer and the insulating hydrogen barrier exposing at least a second portion of the electrical contact to the component;
    a conducting hydrogen barrier on the passivation layer and the exposed second portion of the electrical contact, and in contact with at least a portion of the insulating hydrogen barrier, the conducting hydrogen barrier consisting of a single layer of titanium-aluminum-nitride (TiAlN) or aluminum titanium nitride (AlTiN); and a copper pillar over a top surface of the conducting hydrogen barrier.

15. The microelectronic system of claim 14 further comprising an under bump metallization (UBM) formed over the conducting hydrogen barrier, and wherein the copper pillar is formed on the UBM.

16. The microelectronic system of claim 15 wherein the conducting hydrogen barrier extends over at least a portion of the insulating hydrogen barrier and is patterned to form a redistribution layer (RDL), and wherein the copper pillar is formed over the RDL and the insulating hydrogen barrier.

17. The microelectronic system of claim 15 wherein the conducting hydrogen barrier extends over at least a portion of the insulating hydrogen barrier, further comprising a redistribution layer (RDL) on the conducting hydrogen barrier, and wherein the copper pillar is formed over the RDL and the insulating hydrogen barrier.

18. The microelectronic system of claim 14 wherein the microelectronic system comprises a Micro-Electromechanical Systems (MEMS) device including the component comprising PZT.

19. The microelectronic system of claim 14 wherein the microelectronic system comprises a ferroelectric random access memory and the component comprises a ferroelectric capacitor including a ferroelectric layer comprising PZT.

20. The microelectronic system of claim 14 further comprising a second chip bonded and electrically connected to the first chip through the copper pillars and enclosed in a face-to-face (F2F) package.

* * * * *